United States Patent [19]
Amini et al.

[11] Patent Number: 5,497,378
[45] Date of Patent: Mar. 5, 1996

[54] SYSTEM AND METHOD FOR TESTING A CIRCUIT NETWORK HAVING ELEMENTS TESTABLE BY DIFFERENT BOUNDARY SCAN STANDARDS

[75] Inventors: Ismael Z. Amini, Boca Raton, Fla.; William F. Heybruck, Charlotte, N.C.; Andres M. Molina, Boca Raton, Fla.; Kimberly K. Van Vliet, Charlotte, N.C.

[73] Assignee: International Business Machines Corporation, Armonk, N.Y.

[21] Appl. No.: 146,557

[22] Filed: Nov. 2, 1993

[51] Int. Cl.⁶ .................................. H04B 1/24
[52] U.S. Cl. ........................ 371/22.3; 371/22.1; 371/2; 364/490
[58] Field of Search ................. 371/22.3, 22.1, 371/22.6, 27; 327/202; 364/490, 489

[56] References Cited

U.S. PATENT DOCUMENTS

| | | | |
|---|---|---|---|
| 3,892,954 | 7/1975 | Neuner | 235/153 |
| 4,057,847 | 11/1977 | Lowell et al. | 364/200 |
| 4,195,258 | 3/1980 | Yen | 324/73 |
| 4,402,055 | 8/1983 | Lloyd et al. | 364/579 |
| 4,485,439 | 11/1984 | Rothstein | 364/200 |
| 4,606,025 | 8/1986 | Peters et al. | 371/20 |
| 4,899,306 | 2/1990 | Greer | 364/900 |
| 4,984,239 | 1/1991 | Suzuki et al. | 371/3 |
| 5,157,781 | 10/1992 | Harwood et al. | 395/575 |
| 5,185,745 | 2/1993 | Manca, Jr. | 371/22.3 |
| 5,278,842 | 1/1994 | Berry, Jr. et al. | 371/22.3 |
| 5,281,864 | 1/1994 | Hahn et al. | 327/202 |
| 5,323,400 | 6/1994 | Agarwal et al. | 371/22.3 |
| 5,325,368 | 6/1994 | James et al. | 371/22.3 |
| 5,329,533 | 7/1994 | Liu | 371/22.3 |

*Primary Examiner*—Emanuel T. Voeltz
*Assistant Examiner*—Thomas Peeso
*Attorney, Agent, or Firm*—Richard M. Goldman

[57] ABSTRACT

Disclosed is a test method and system for boundary testing a circuit network. The network, made up of individual integrated circuit chips mounted on a printed circuit card or board, has at least one integrated circuit that is testable by IEEE 1149.1 Standard boundary testing, and at least one second integrated circuit that is testable by Level Sensitive Scan Design boundary testing but not by IEEE 1149.1 Standard boundary testing. The test system has a test access port interface with a test access port controller with Test Clock, Test Data In, Test Data Out, Test Mode Select, and Test Reset I/O. The test access port also has an instruction register, a bypass register, a test clock generator, and a Level Sensitive Scan Device boundary scan register.

12 Claims, 15 Drawing Sheets

TAP CIRCUIT LOCATION ON FIXTURE

TAP DEVICE CONSISTS OF A TAP CONTROLLER,
IR, BYPASS REGISTER, AND CLOCK CIRCUITRY.

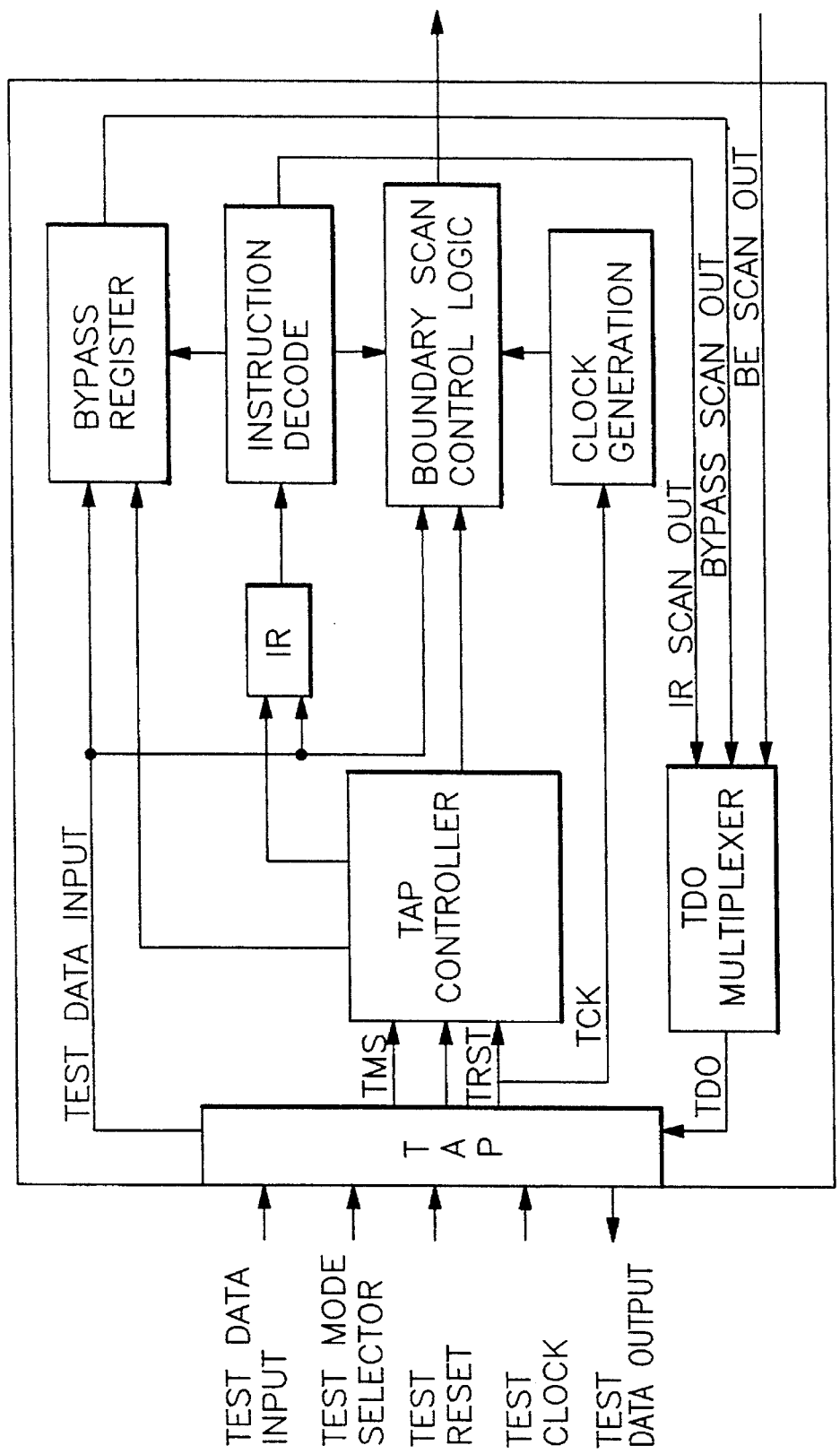

SYSTEM AND METHOD FOR TESTING A CIRCUIT NETWORK HAVING ELEMENTS TESTABLE BY DIFFERENT BOUNDARY SCAN STANDARDS

FIELD OF THE INVENTION

The invention relates to boundary scan testing of electronic circuit networks having individual integrated circuit chips testable by the IEEE 1149.1 Standard and other individual integrated circuit chips not testable by the IEEE 1149.1 Standard, but testable by Level Sensitive Scan Design. Modern boundary scan testing technology consists of IEEE 1149.1 Standard boundary scan testing and other methodologies, many of which are incompatible with the IEEE 1149.1 Standard. Generating test patterns for both types of boundary scan testing, as when both types of integrated circuit chips are present in the same circuit network, i.e., on the same printed circuit board or card, has heretofore been accomplished only through special custom programming. According to the system and method of the invention described herein, commonly available software can be used to automatically generate test patterns for circuit networks with mixed integrated circuit types.

BACKGROUND OF THE INVENTION

Boundary Scan Testing

Boundary scan testing is described in many papers, including R. W. Bassett, M. E. Turner, J. H. Panner, P. S. Gillis, S. F. Oakland, and D. W. Stout, "Boundary Scan Design Principles for Efficient LSSD ASIC Testing," *IBM Journal of Research and Development*, Vol. 34, No. 2/3, March/May 1990, pp. 339–354.

Heretofore functional testing of printed circuit boards has been carried out by test fixtures that facilitated "bed of nails" contact of the individual integrated circuit leads. The development of high pin count devices and surface mount technology, with high populations of high I/O density, grid array components, on both sides of a card or board, has made bed of nails testing prohibitively expensive. To allow bed of nails testing, surface mount packages must either sacrifice their high I/O advantage and chip density, or even more complex and costly testing fixtures must be used.

Boundary scan testing provides an alternative to bed of nails testing. Boundary scan testing provides board signal node access while avoiding in circuit test fixturing. Boundary scan techniques replace the physical access points needed for in-circuit testing with equivalent logical access points. These equivalent logical access points are the boundary scan latches. The boundary scan latches correspond to the signal I/O pins of each component.

The board testing applications of boundary scan methodology have led to development of many boundary scan testing technologies, including Level Sensitive Scan Design devices and IEEE 1149.1 Standard devices.

IEEE 1149.1 Standard Boundary Testing

The IEEE 1149.1 Standard requires a chip architecture where each conforming chip has a standard Test Access Port (TAP) designed and incorporated as an internal component thereof. This integral Test Access Port is operated by means of a four pin test signal interface. The signal pins of the Test Access Port comprise a Test Clock (TCK), a Test Mode Select (TMS), a serial Test Data Input (TDI), and a serial Test Data Output (TDO).

The basic elements of the IEEE 1149.1 Standard architecture are illustrated in FIGS. 1 through 6. FIG. 1 shows a schematic overview of an IEEE 1149.1 Standard integrated circuit chip, with peripheral boundary scan cells, internal system logic, and the Test Access Port, with the TCK and TMS inputs to the test access port, the TDI input to the Instruction and Bypass Registers, the multiplexer, and the TDO output from the test access port. FIG. 2 shows an individual IEEE 1149.1. Standard Boundary Scan Cell. FIG. 3 shows the IEEE 1149.1. Standard boundary scan architecture and logic flow. FIG. 4 shows all of the IEEE 1149.1 Standard Data Register, and FIG. 5 shows the Instruction Register outputs.

The Test Access Port is controlled by an internal, synchronous, finite state machine with sixteen states. Its behavior is controlled by the values placed on the TMS input at the time of a rising edge transition on the TCK signal. The state machine can be initialized to a known reset state within five clock signals.

The Test Access Port contains a serially loadable instruction register and a one bit scan bypass register.

According to the IEEE 1149.1 Standard all component signal I/O pins, other then test signal interface pins, must be directly connected to logically adjacent boundary scan cells. The boundary scan cells must be interconnected to form a single boundary scan shift register operated under Test Access Port control.

Under the IEEE 1149.1 Standard there are three mandatory instructions which must be supported: BYPASS, EXTEST, and SAMPLE. BYPASS permits board level shift register reconfiguration. This allows more efficient scanning by using the Bypass Register to bypass a module's boundary scan register when the module does not need to be included in a certain test. EXTEST permits test of board level interconnection wiring using the boundary scan register. SAMPLE permits monitoring of signals entering and leaving a component during normal system operation using the boundary scan register. The basic boundary scan cell design is shown in FIG. 1.

Level Sensitive Scan Design Boundary Testing

Level Sensitive Scan Design integrated circuit chips can be fully tested without contacting all of the product pins simultaneously. In a Level Sensitive Scan Design integrated circuit chip all of the latches are part of a scannable chain. Boundary scan testing adds the requirement that each driver and receiver must have an associated latch that is also part of a scannable chain. With boundary scan Level Sensitive Scan Design it is possible to directly control and observe the state of all drivers, receivers, and latches on a chip while contacting only scan pins, including boundary scan pins, clocks, and LSSD control pins. Through the use of Level Sensitive Scan Design a low pin count tester can test all of a chip's area except for chip circuitry outside the boundary scan latches. LSSD testing also allows for AC testing.

LSSD testing is based upon logical partionability at Shift Register Latch boundaries that correspond closely to component signal I/O pin boundaries. In LSSD a logic network consisting of one or more conforming components is partitioned into two distinct, independently testable regions. The first region consists of the internal functional logic enclosed by the Boundary Shift Register Latches on each component. The second region consists of the component pins and any logic external to the Boundary Shift Register Latches, such as the off-chip driver and receiver circuits attached to the I/O pins and their interconnect wiring between board components.

A Level Sensitive Scan Design device is shown schematically in FIG. 6. First to be noted is that in a LSSD device there is a distinction between pins required to perform specific testing functions and those not having such a requirement. LSSD system clocks, scan clocks, scan gates, and scan data inputs, that is, the inputs required for LSSD scanning and clocking operations, are categorized as Test Function Primary Inputs (TFPI's). LSSD scan data outputs are characterized as Test Function Primary Outputs (TFPO's). All other data and input pins are classified as Data Primary Inputs (Data PI's) and Data Primary Outputs (Data PO's).

LSSD devices are subject to the following design rules:

1. There must be a Test Function Primary Input (TFPI) sensitizing condition consistent with the LSSD scan state and scan sequence that makes all internal logic signals and all embedded memory controllable and observable using only the Test Function Primary Inputs (TFPI's), the Test Function Primary Outputs (TFPO's), and the Shift Register Latches (SRL's). This excludes data PI's and data PO's from being used during any internal testing operations.

2. There must be a Test Function Primary Input (TFPI) sensitizing condition consistent with the LSSD scan state and scan sequence that makes all external logic signals including all I/O pins (TFPI's, data PI's, TFPO's, and data PO's) controllable and observable using only the Boundary Shift Register Latches (SRL's) and the I/O pins themselves. This excludes any internal Shift Register Latches, i.e., those not designated as Boundary Shift Register Latches, from being used during external testing operations.

3. All logic signals must be included in either or both the internal region or the external region, and each possible value of a signal must be testable, that is simultaneously controllable and observable, under at least two of the sensitizing conditions. This states that it must be possible to fully test all of the logic signals using one of the above rules.

These three design rules permit two basic BSRL arrangements for data PI's and data PO's. The data input structures are shown in FIGS. 7 and 8. The corresponding data output structures are shown in FIGS. 9 and 10. FIGS. 8 and 10 show circuits that must be classified as TFPI's in order to satisfy controllability and observability conditions of the above design rules.

FIGS. 9 and 10 illustrate the implicit requirement that off-chip driver-enable signals fed by internal system logic must be intercepted by BSRL structure. The circuits shown in FIGURES also show that a second driver-enable output that is controlled by a TFPI. This additional driver-inhibit control is included for board testing. It provides a test function input on each component that can be used by the board designer to prevent contention between three-state drivers on multi-source board signal nodes during LSSD scanning operations.

Level Sensitive Scan Design devices are testable under the LSSD standard without incorporation of the IEEE 1149.1 Standard elements, such as the Test Access Port (including TCK, TDI, TMS, TDO, and TRST I/O connections), a Test Access Port Controller, an instruction register, a boundary scan test bypass register, or a test data output multiplexer for multiplexing between the Bypass, Instruction, and Boundary Scan registers. Moreover, the LSSD Boundary Scan Latches do not implement the UPDATE signal.

Mixed IEEE 1149.1 Standard and Level Sensitive Scan Design Boundary Testing

Most clearly, Level Sensitive Scan Design differs from IEEE 1149.1 Standard in the provisions for clocking and scanning, as well as the use of tristate drivers. There are also other significant architectural and implementation differences at the chip and I/O level, as noted above.

Notwithstanding these differences, it is frequently necessary to combine LSSD and IEEE 1149.1 Standard devices on the same printed circuit board or card. There is, at present, no readily available method of or apparatus for testing a card or board containing both LSSD and IEEE 1149.1 Standard devices in a single testing operation.

OBJECTS OF THE INVENTION

It is a primary object of the invention to provide a method of boundary scan testing a card or board containing both LSSD and IEEE 1149.1 Standard devices in a single testing operation.

It is a further object of the invention to provide a boundary scan fixture for testing a card or board containing both LSSD and IEEE 1149.1 Standard devices in a single testing operation.

SUMMARY OF THE INVENTION

These and other objects are attained by the boundary scan testing method and apparatus of our invention. According to our invention there is provided a system, including a fixture and an integrated circuit, that allows the testing of a circuit network, e.g., a populated printed circuit card or board, having integrated circuits testable by the IEEE 1149.1 Standard boundary testing, and other integrated circuits, not testable by IEEE 1149.1 Standard boundary testing, but testable by Level Sensitive Scan Design (LSSD) testing.

The test system of the invention, including the test fixture and the test circuitry is useful for boundary scan testing a circuit network characterized by dissimilar integrated circuits therein. That is, the circuit under test has at least one first integrated circuit that is testable by IEEE 1149.1 Standard boundary testing, and at least one second integrated circuit that is testable by Level Sensitive Scan Design (LSSD) boundary testing but not by IEEE 1149.1 Standard boundary testing. The second integrated circuit chip is typically one requiring, among other things, three clocks for testing.

Panel testing is carried out in a testing fixture. The fixture has an integrated circuit chip including a Test Access Port interface. The Test Access Port interface of the fixture's embedded integrated circuit chip implements the boundary scan testing logic missing in LSSD chips. These missing items supplied by the fixture include the Test Access Port, with TCK, TDI, TMS, TDO, and TRST inputs as well as a boundary scan input register, a boundary scan test output register, a test data output multiplexer, and a compatible implementation of the UPDATE register. The test access port interface also includes a Level Sensitive Scan Device boundary scan register.

The Level Sensitive Scan Device boundary scan register of the system has a set of control input signals not found in or required by the IEEE 1149.1 Standard. These control signals include the three LSSD clocks: CLK_A, CLK_B, and CLK_C. These signals also include the boundary scan output, BSCO, and the boundary scan input, BSCI. The controls also include data inhibit, DI1.

In the test system the BSCO controls boundary scan cells on the Level Sensitive Scan Device integrated circuit chip associated with drivers, and the BSCI controls boundary scan cells on the Level Sensitive Scan Device integrated circuit chip associated with receivers.

The Level Sensitive Scan Device Boundary Scan Register controls the Boundary Scan Output, BSCO, and the Boundary Scan Input, BSCI, when Test Access Port control lines Shift Data Register, SHIFTDR, and Boundary Scan Register Select, BSSEL, are high. The Level Sensitive Scan Device Boundary Scan Register also controls BSCO and BSCI when Test Access Port control lines Update Data Register, UPDATDR, and Boundary Scan Register Select, BSSEL, are high.

The Data Inhibit Signal DI1 is high and data is sent out to the circuit network from the Level Sensitive Scan Device integrated circuit chip when the Boundary Scan Select BSSEL and one of Update Data Register, Select Data Register, or Capture Data Register is high. The Data Inhibit DI1 is connected to the inhibit pins of the Level Sensitive Scan Device. By this expedient when DI1 is low no signals are transmitted over the circuit network from non-selected second integrated circuit chips. When the Data Inhibit DI1 is high the Level Sensitive Scan Device chip drivers are enabled and Level Sensitive Scan Device boundary scan cell contents are transmitted over the circuit network from selected second integrated circuit chips.

THE FIGURES

The invention may be understood by the reference to the FIGURES appended hereto.

FIG. 12 shows the logic block diagram of the test access port and other circuitry of the embedded chip.

Figures 15A, 15B:
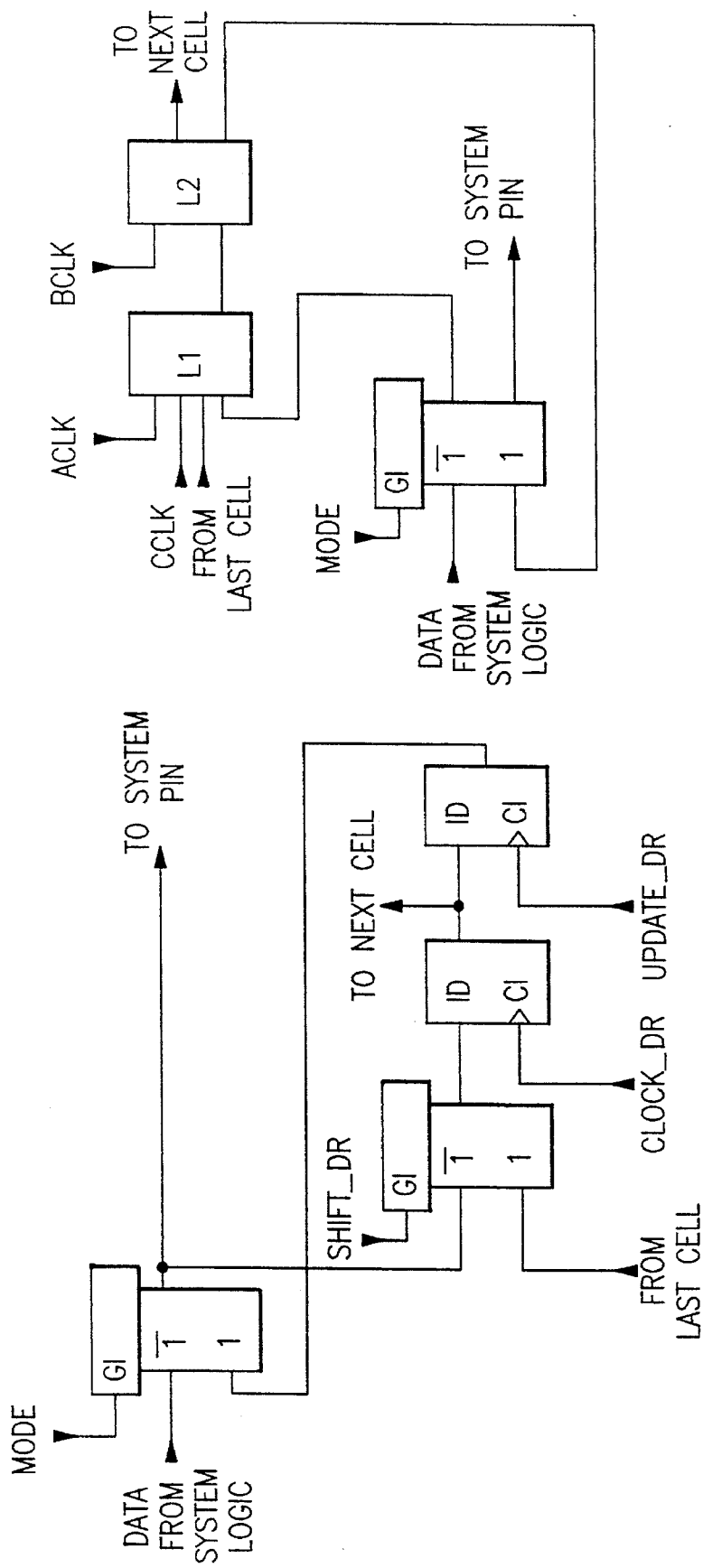

FIG. 15, including FIG. 15A and FIG. 15B, is a side by side comparison of an IEEE 1149.1 Standard Boundary Scan Cell and a Level Sensitive Scan Device Boundary Scan Cell.

FIG. 15A shows an IEEE 1149.1 Standard Boundary Scan Cell.

FIG. 15B shows a Level Sensitive Scan Device Boundary Scan Cell.

Figure 16:
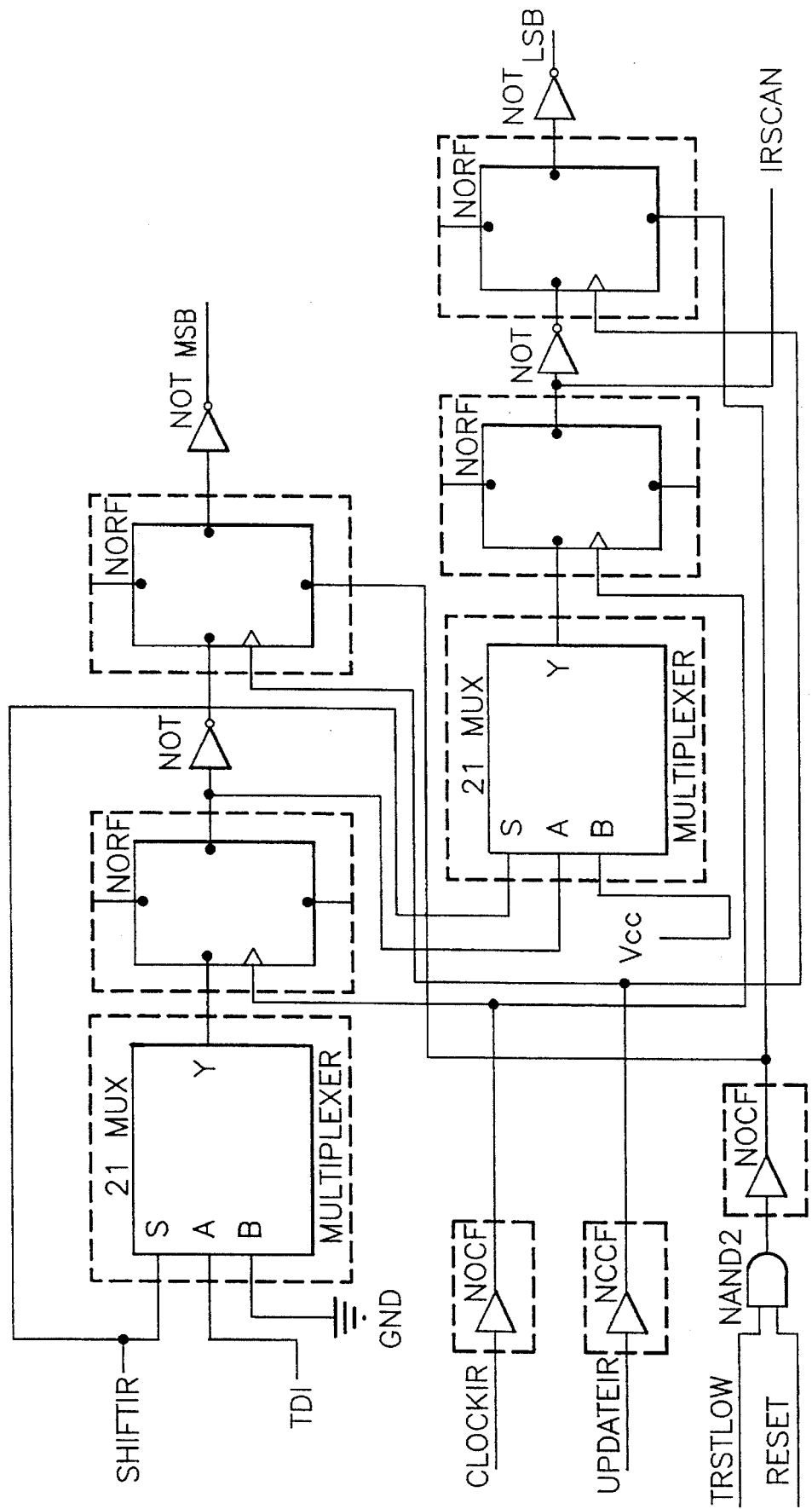

FIG. 16 shows the logic diagram of the Instruction Register.

Figure 17:
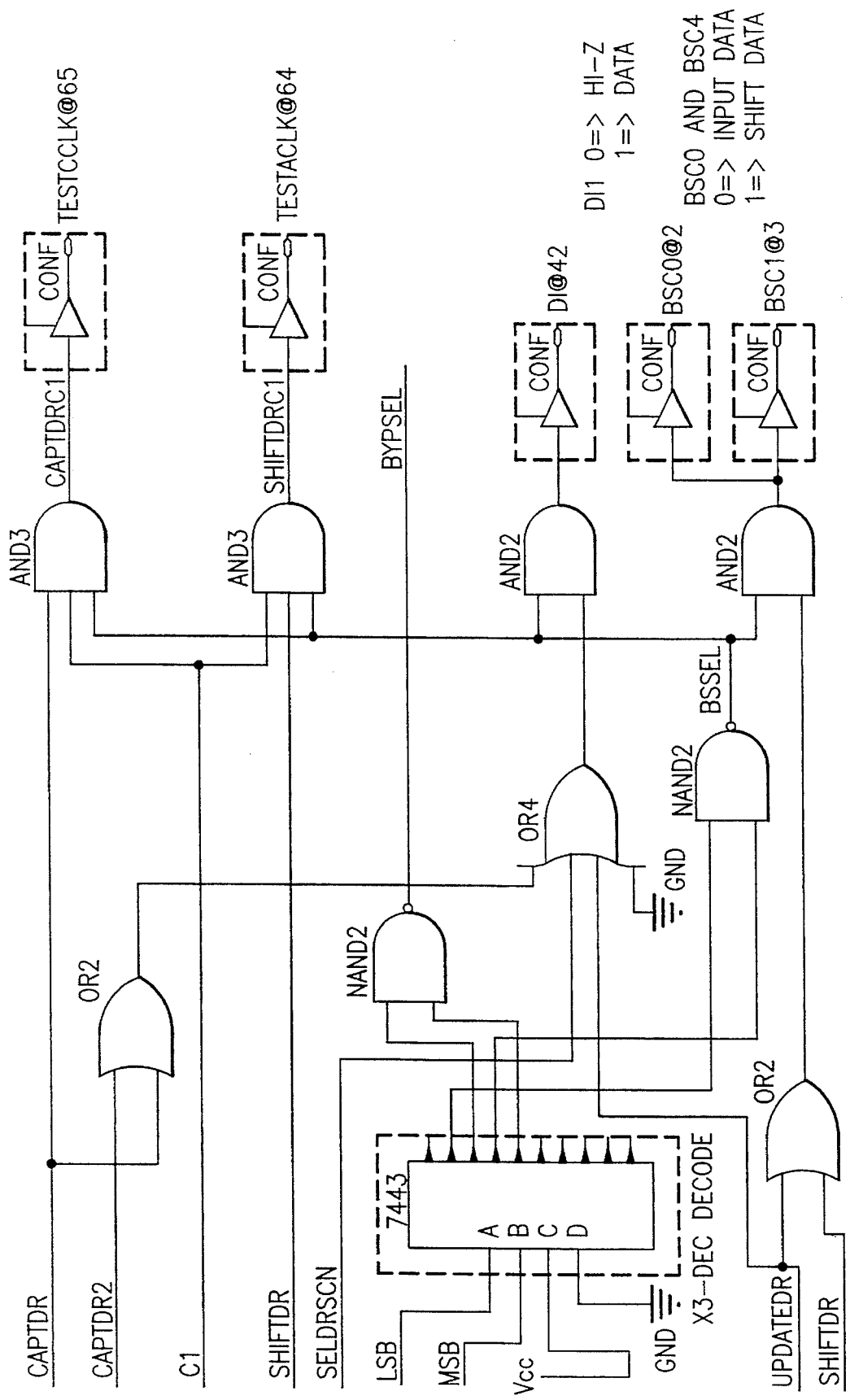

FIG. 17 shows the logic diagram for the boundary scan control logic.

Figure 18:
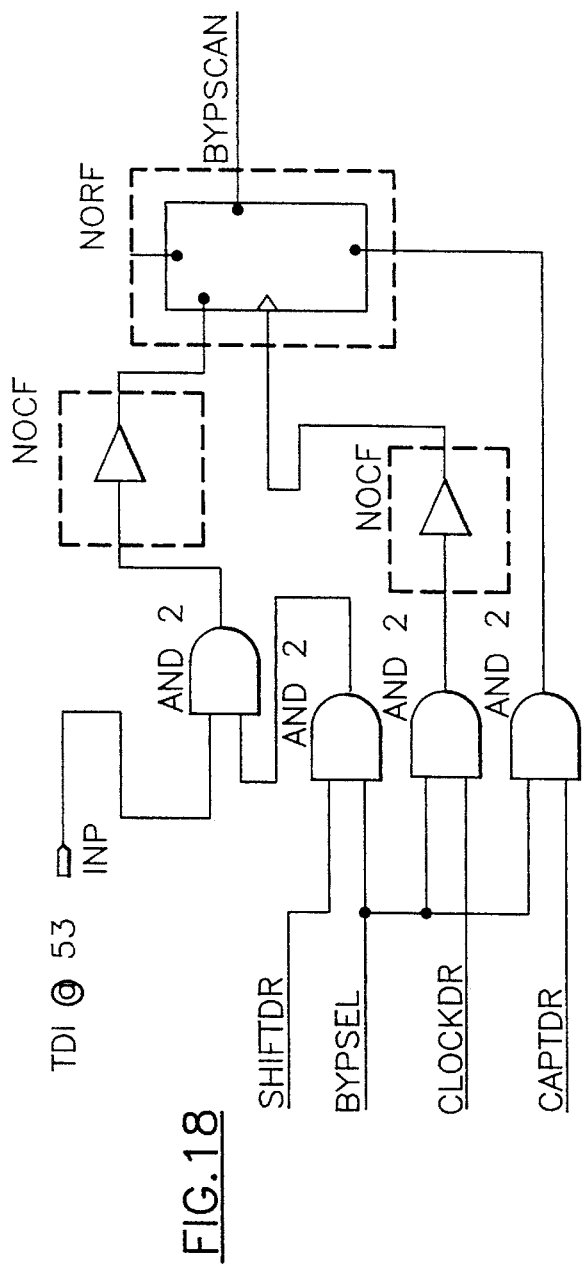

FIG. 18 shows the logic diagram for the bypass register.

Figure 19:
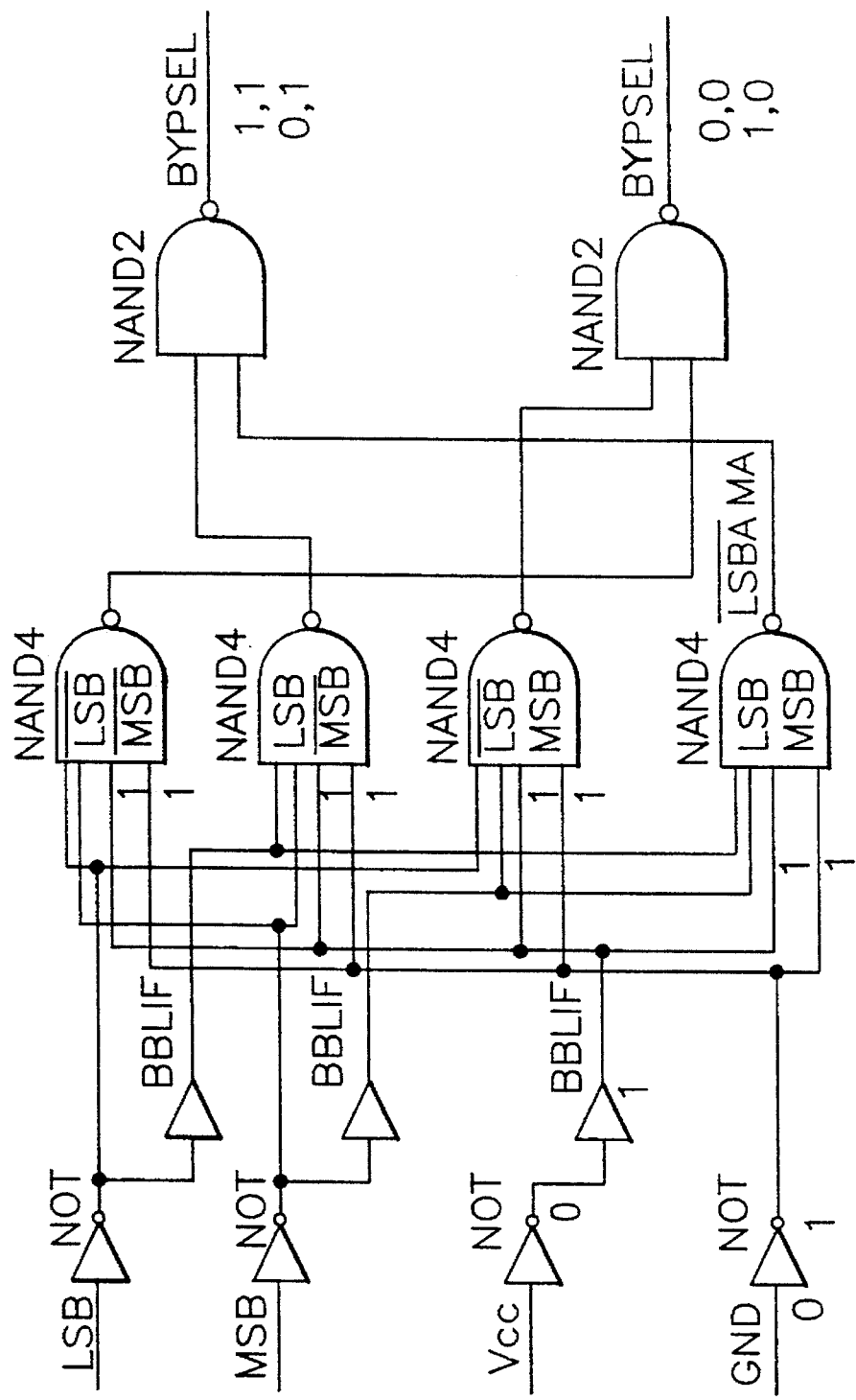

FIG. 19 shows the logic diagram for the instruction decode logic.

Figure 20:
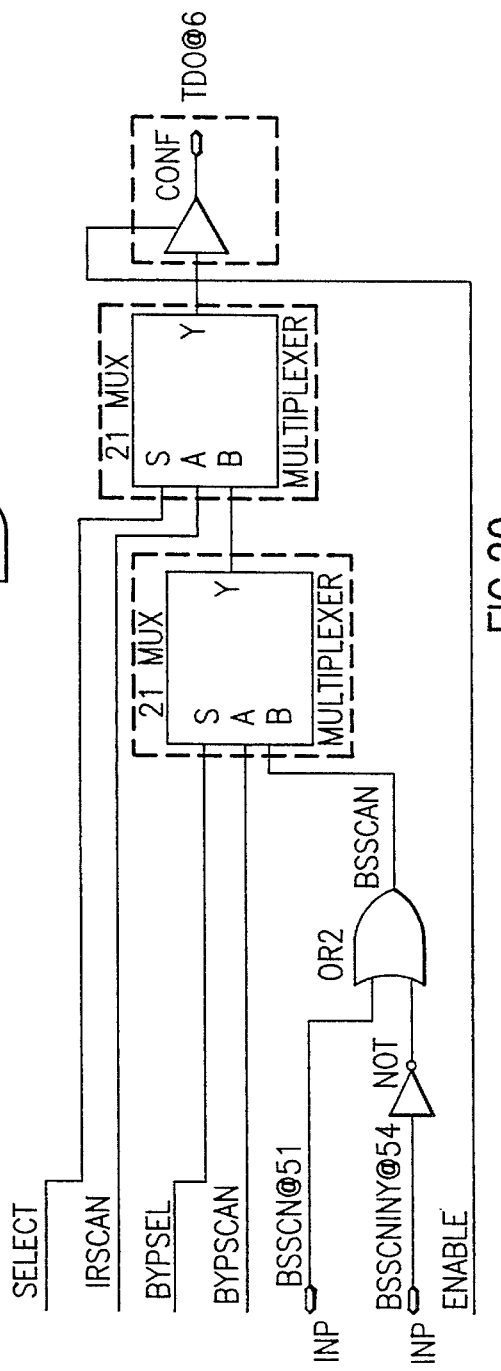

FIG. 20 shows the logic diagram for the TDO multiplexer.

Figure 21:
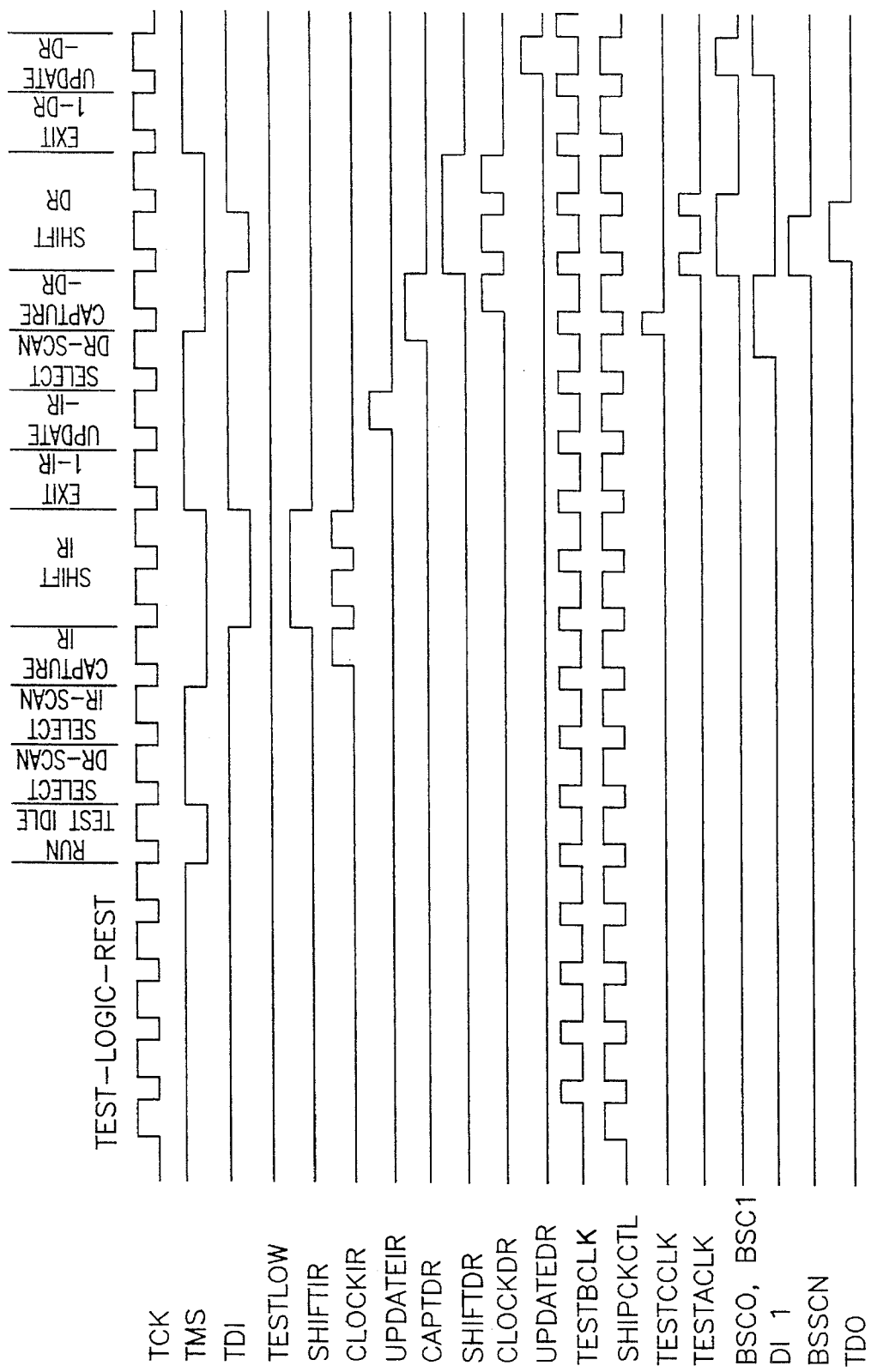

FIG. 21 shows the timing diagram for the Test Access Port.

DETAILED DESCRIPTION OF THE INVENTION

According to our invention there is provided a method and a system for testing integrated circuit chip networks on a printed circuit board or card. The system, including a fixture and an integrated circuit, allows the testing of a circuit network. A circuit network is a populated printed circuit card or board, having integrated circuits testable by the IEEE 1149.1 Standard boundary testing, and other integrated circuits, not testable by IEEE 1149.1 Standard boundary testing, but testable by Level Sensitive Scan Design (LSSD) testing.

At the present time software exists to generate infrastructure tests and interconnect tests between electronic devices, for example, integrated circuit chips, utilizing the IEEE 1149.1 Standard. Software also exists to automatically generate tests between devices utilizing other standards, such as the Level Sensitive Scan Device standard. However, there has heretofore been no software that will automatically generate interconnect tests between devices, such as integrated circuit chips, of different and heretofore incompatible types of boundary scan standards.

Utilizing the method and apparatus described herein, circuit networks, that is, populated electronic circuit cards, incorporating devices of the IEEE 1149.1 Standard and another standard, as the Level Sensitive Scan Device standard, can have interconnect tests generated quickly and efficiently using commercially available boundary scan software.

Figure 1:
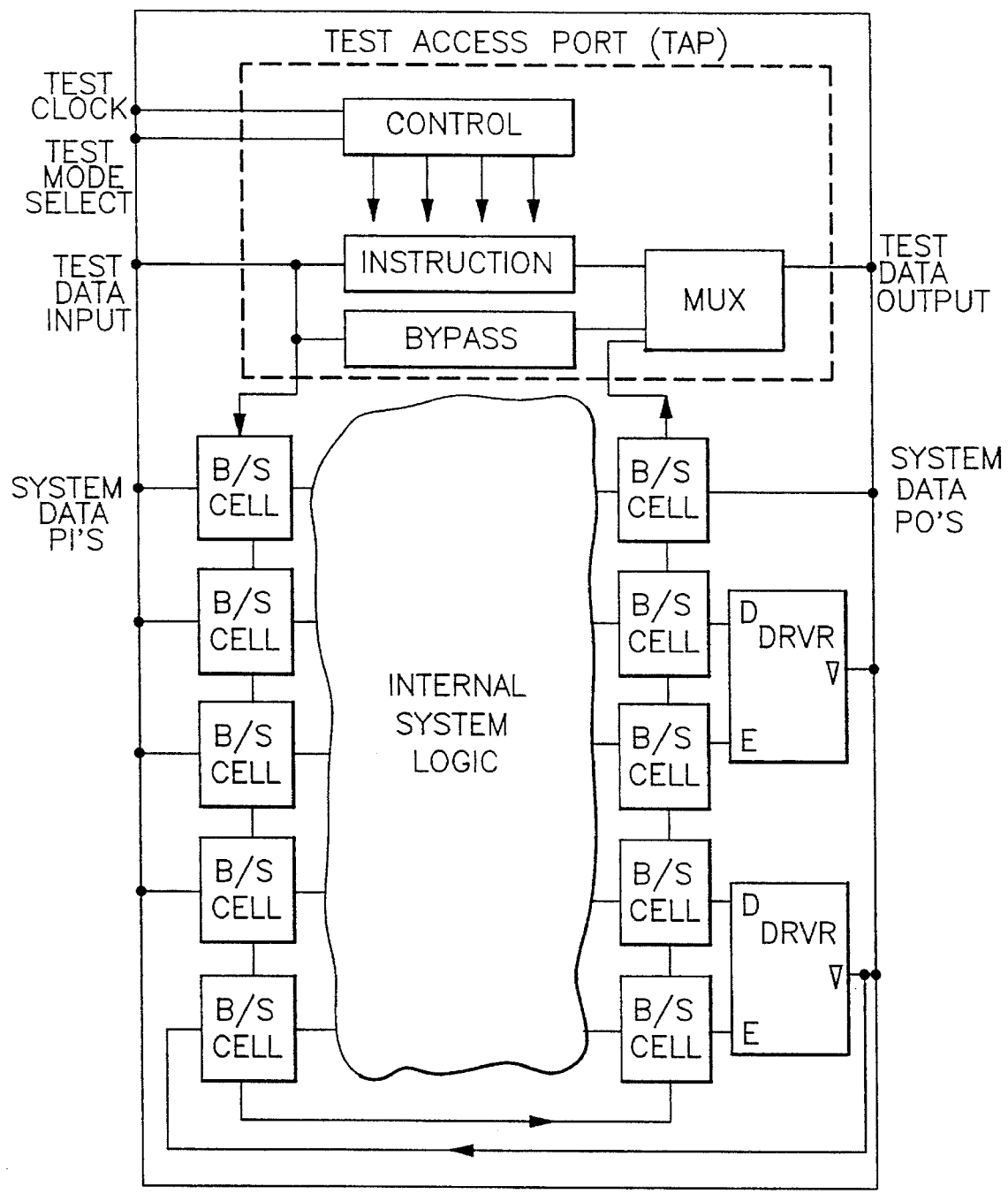
FIG. 1 shows a schematic overview of an IEEE 1149.1 Standard integrated circuit chip, with peripheral boundary scan cells, internal system logic, and the Test Access Port, with its inputs and outputs.
Figure 2:
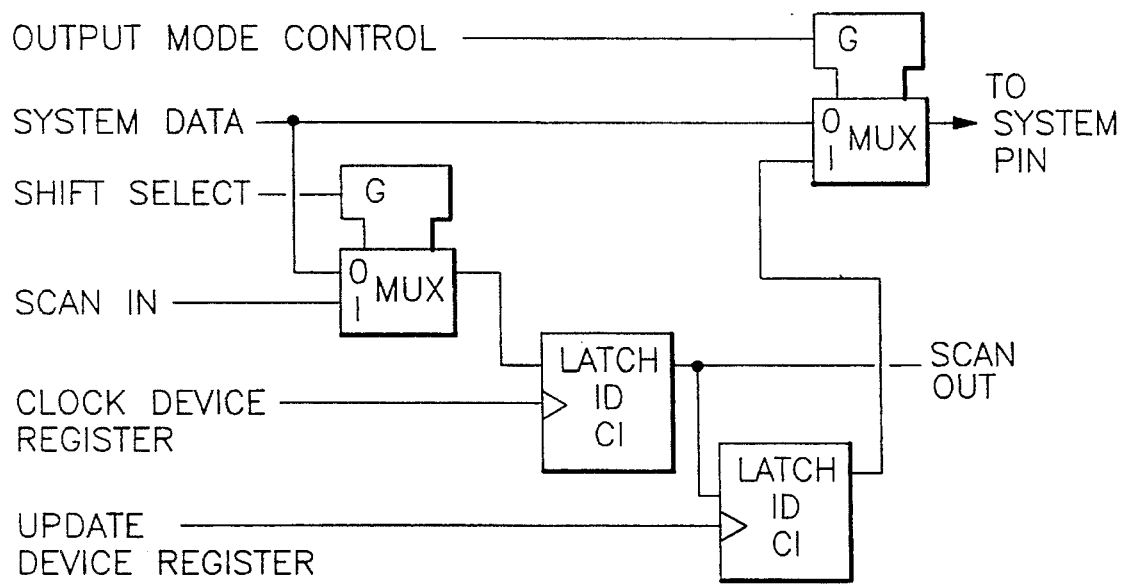
FIG. 2 shows an individual IEEE 1149.1 Standard Boundary Scan Cell.
Figure 7:
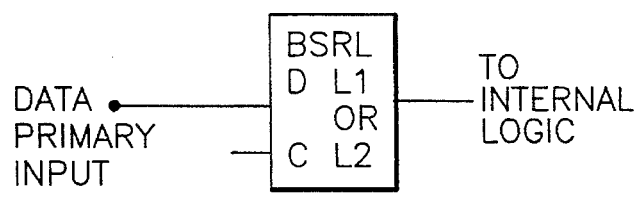
FIG. 7 shows an LSSD boundary scan data input.
Figure 8:
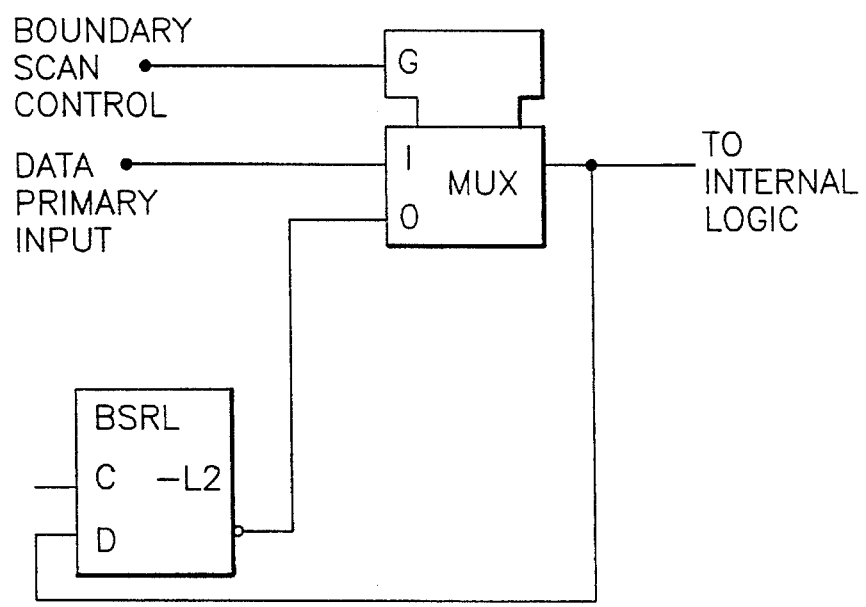
FIG. 8 shows an LSSD boundary scan data input.
Figure 3:
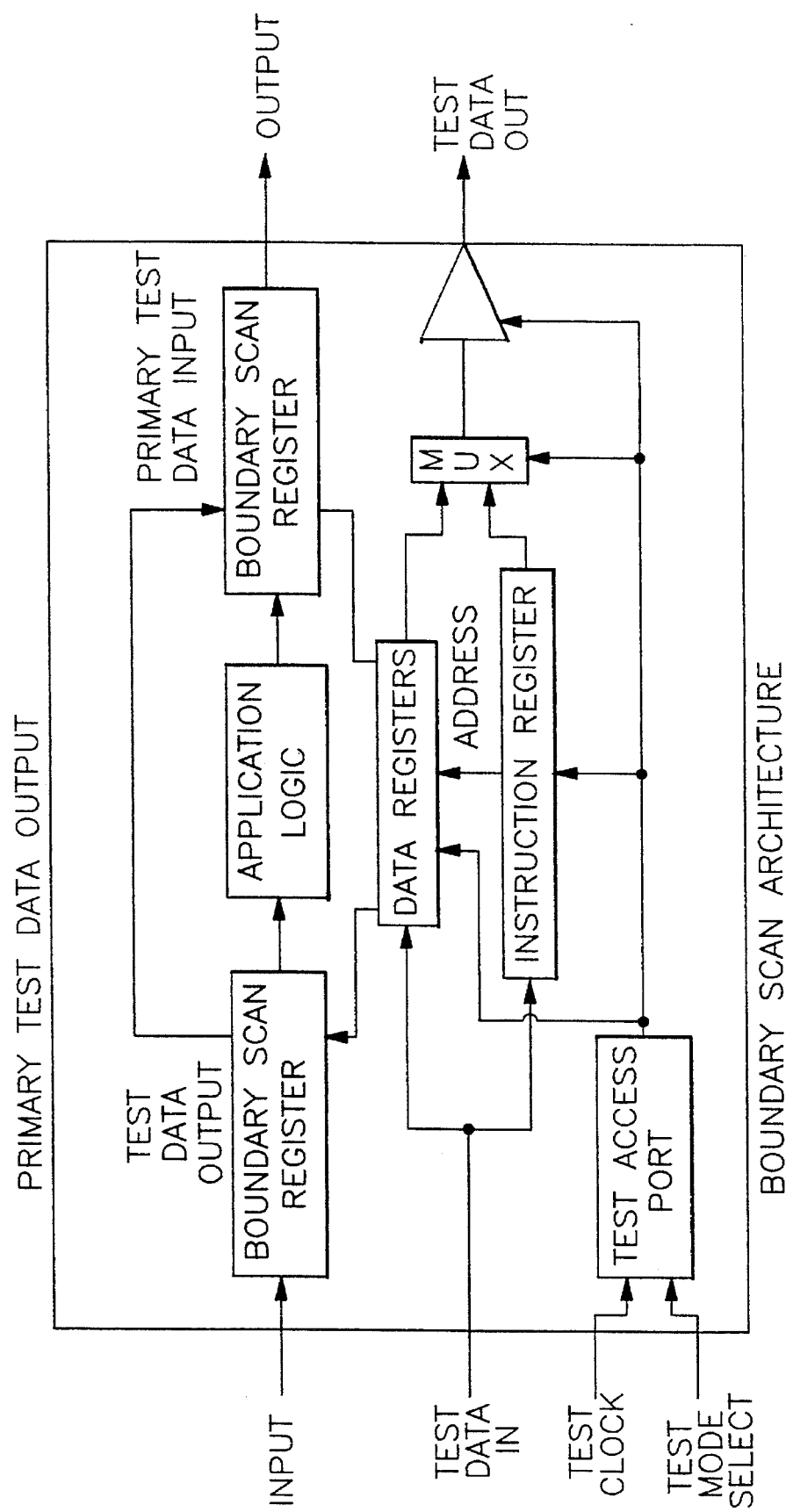
FIG. 3 shows the IEEE 1149.1 Standard boundary scan architecture and logic flow.
Figure 4:
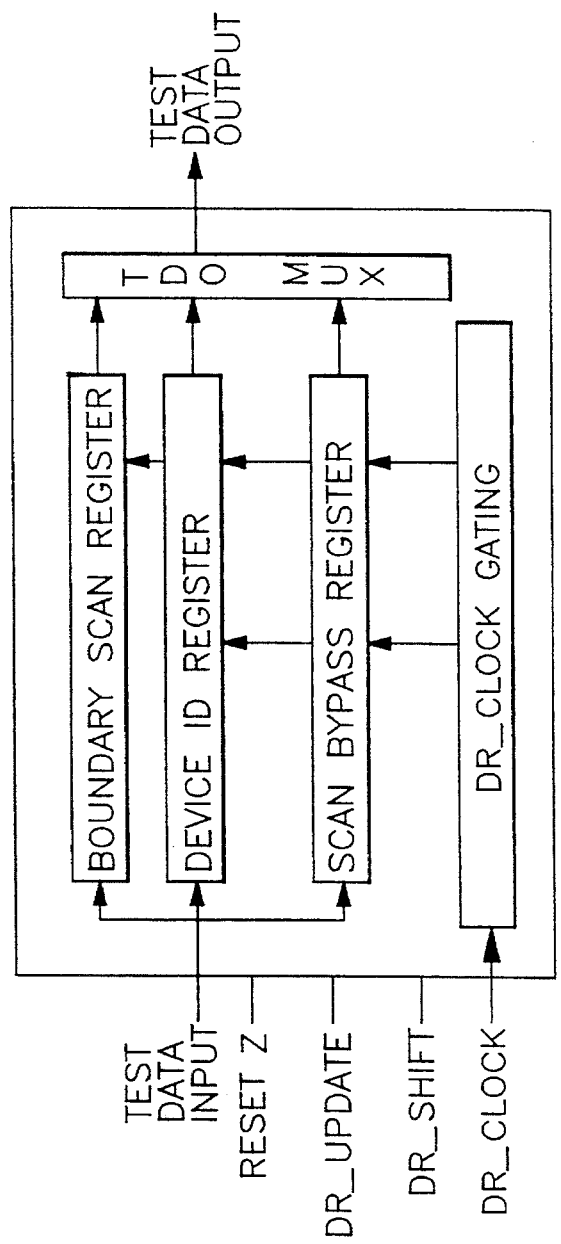
FIG. 4 shows an IEEE 1149.1 Standard Data Register.
Figure 5:
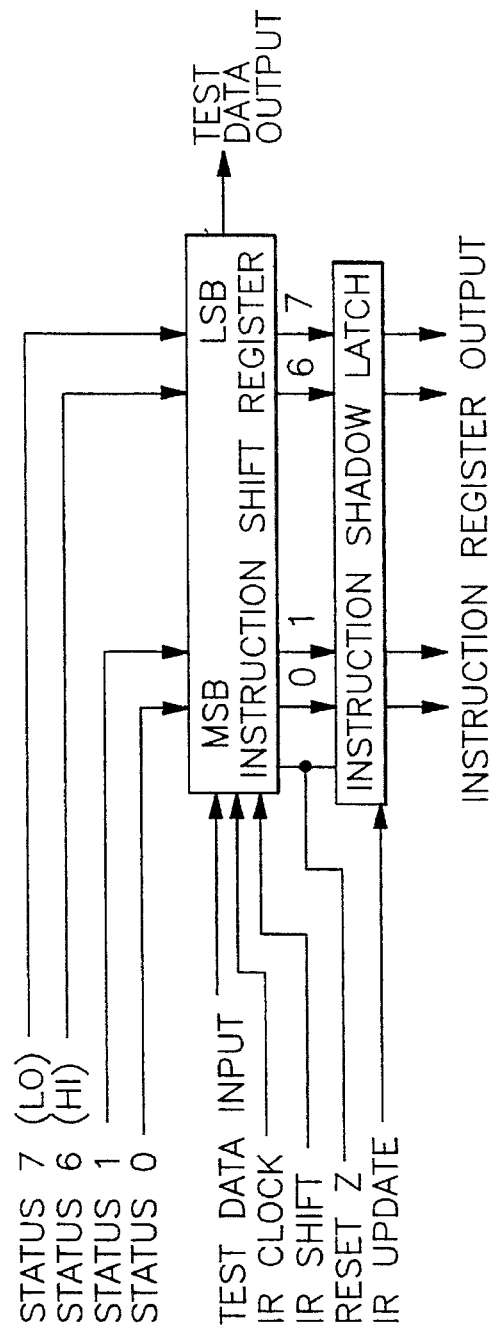
FIG. 5 shows the IEEE 1149.1 Instruction Register outputs.
Figure 6:
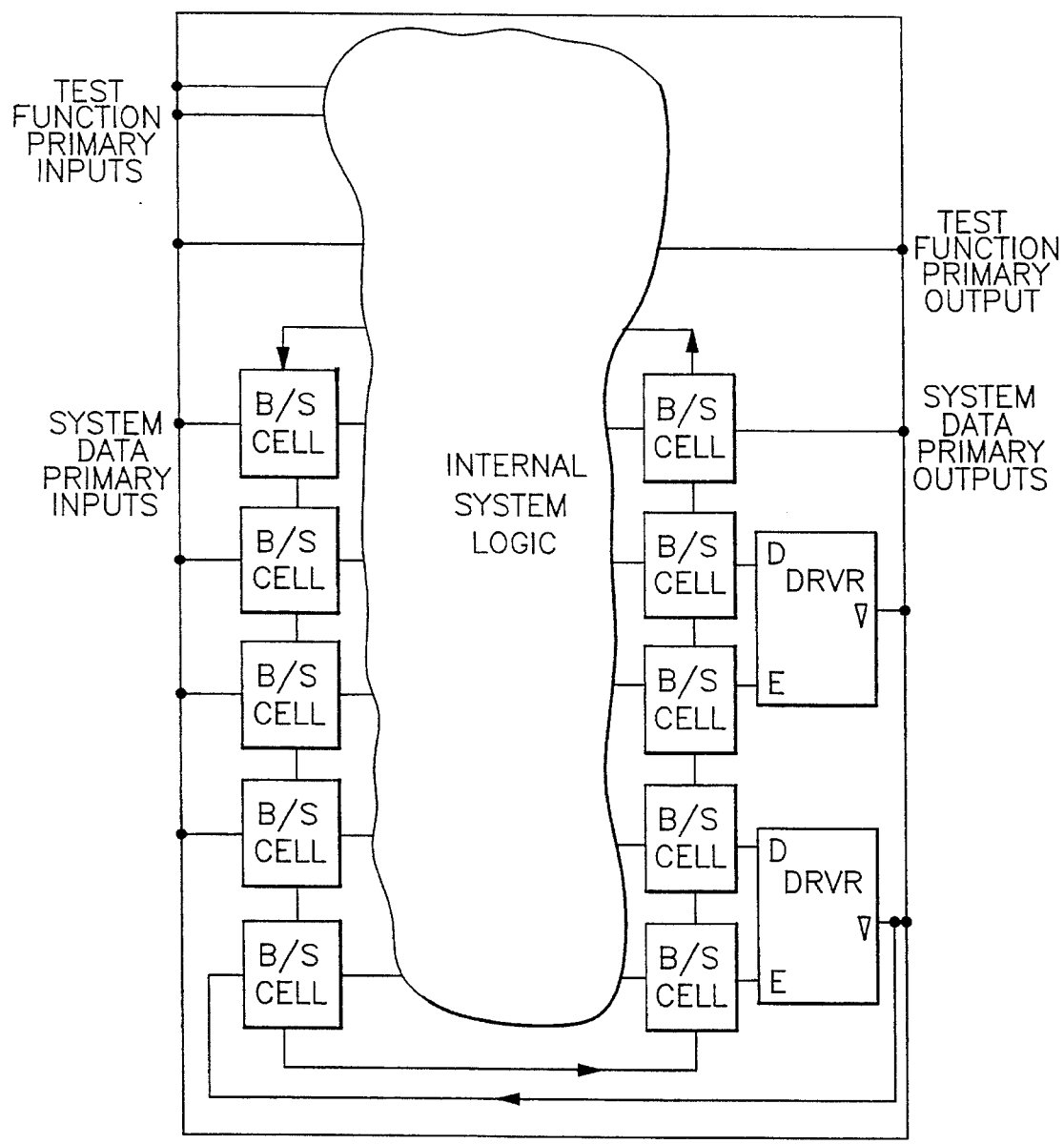
FIG. 6 shows a schematic overview of a Level Sensitive Scan Device integrated circuit chip, with peripheral boundary scan cells, and with test function inputs going directly into the internal system logic, and test function outputs coming directly out of the internal system logic.
Figure 9:
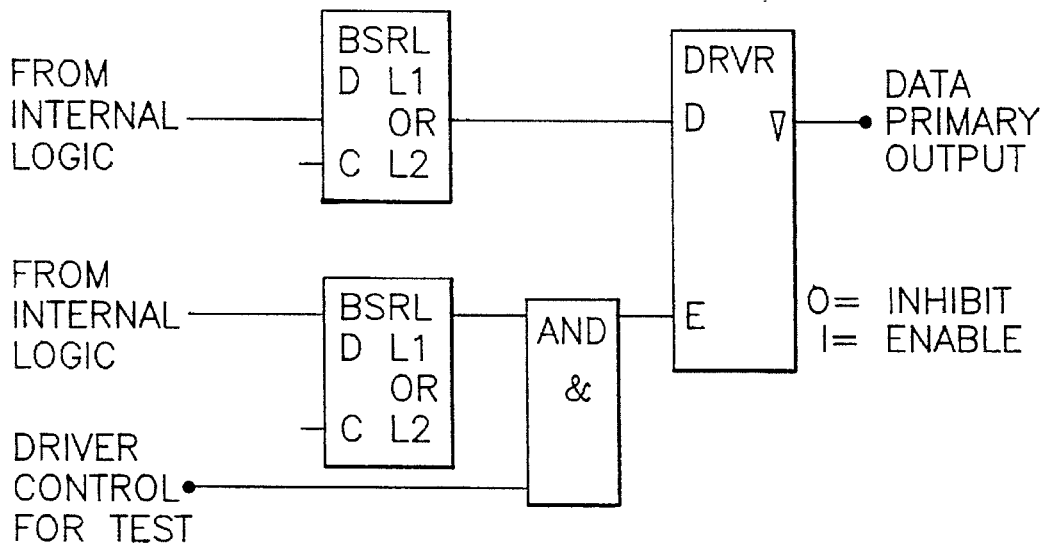
FIG. 9 shows an LSSD boundary scan data output.
Figure 10:
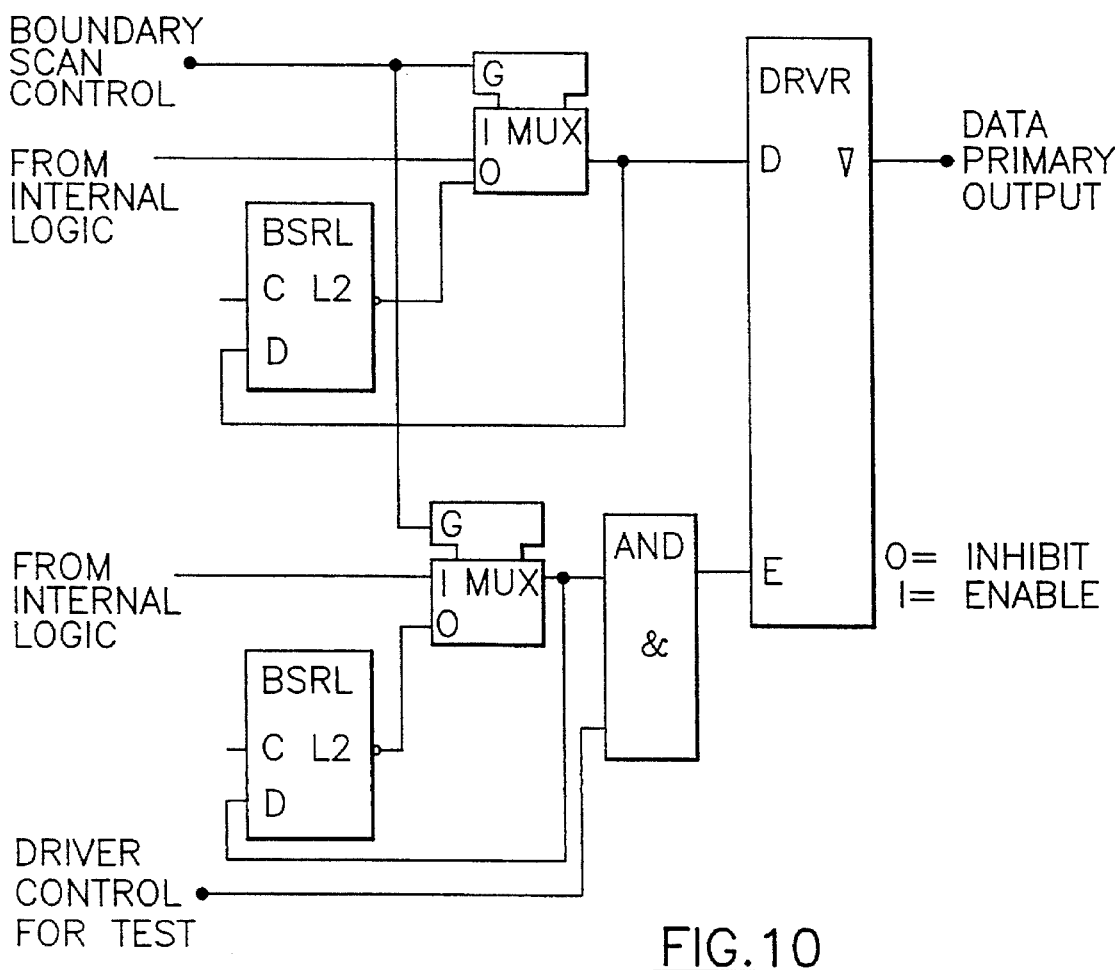
FIG. 10 shows an LSSD boundary scan data output.
Figure 11:
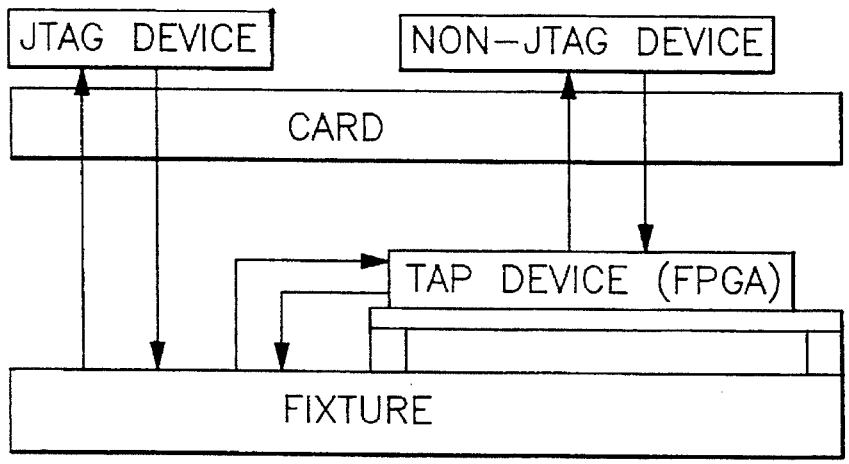
FIG. 11 shows a schematic view of a test fixture of the invention with an IEEE 1149.1 device and an LSSD device in position for testing.

The fixture of the invention is shown generally in FIG. 11. The fixture imposes the test access port interface chip of the invention between the fixture and the LSSD integrated circuit chips under test. The circuit has a Test Access Port ("TAP"), having the chip logic block diagram shown in FIG. 12 and the state machine schematic shown in FIG. 13. The TAP circuitry contains a state machine as well as a pair of registers, the Instruction Register, and the Bypass Register. This circuit is built according to the IEEE 1149.1 Standard, as described hereinabove. However, according to the system and method of our invention this Test Access Port is not incorporated in the chip or chips under test, but is, instead, separate from the chips under test, incorporating IEEE 1149.1 Standard functions not on the LSSD chip, and is free standing, as part of the test fixture of the invention. However, this separate and distinct circuit is incorporated within the scan definition of an LSSD module in the card under test. Incorporation of the scan definition in this way causes the tester to behave as if the Test Access Port were a part of the Level Sensitive Scan Device under test. This requires manipulation of the net data provided by the design tool. Certain nets must be added and other nets must be deleted so that the tester generates the proper patterns. For this reason, some nets are defined as linkage pins in the Boundary Scan Design Language (BSDL) to force the tester to ignore them. To be noted is that the nets needed to link the clock outputs of the Test Access Port and the Level Sensitive Scan Device are physically real. However, they must be ignored for Automatic Test Generation (ATG) purposes but not for test purposes, since the connections between added circuits and the card must be tested before the scan test is run.

Test Access is the function of this Test Access Port chip. It is the interface between the devices that are tested under the IEEE 1149.1 Standard and the devices that are tested under the Level Sensitive Scan Device standard.

According to one embodiment of the invention the Test Access Port chip is incorporated in a Field Programmable Gate Array. One suitable Field Programmable Gate Array is a Xilinix XC4000 Gate Array. The use of a Field Programmable Gate Array permits the circuit to be adaptable to the special and unique requirements of the non-IEEE 1149.1 chip, i.e., the Level Sensitive Scan Device integrated circuit chip. One reason for a special interface is that while an IEEE 1149.1 Standard chip requires a single clock signal, a Level Sensitive Scan Device integrated circuit chip requires two or even three separate clock signals, all of which must be generated from the single clock signal, TCLK, of the IEEE 1149.1 Standard interface. This can be accomplished with the simple combinational circuits shown in FIG. 14. The combinational circuit there shown has a single input, TCLK. This is the IEEE 1149.1 Standard interface clock. The TCLK signal is ANDed with a delayed TCLK signal to yield the LSSD A_CLK signal. The TCLK signal is inverted, and the inverted TCLK signal is ANDed with a delayed inverted TCLK signal to yield the LSSD B_CLK signal.

Figure 14:
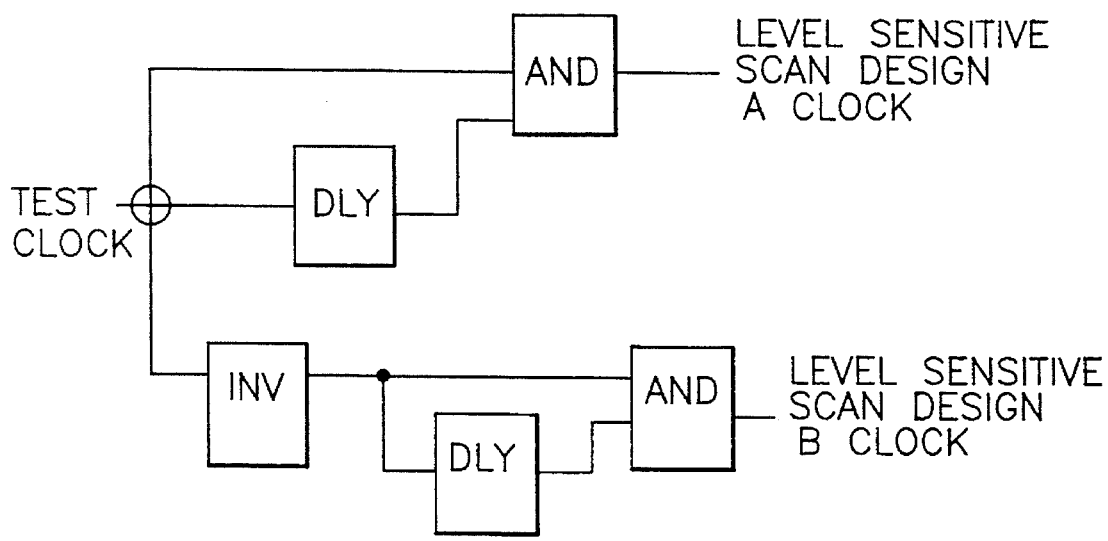
FIG. 14 shows the logic diagram for generating clock signals for the LSSD device from the single clock signal of the TCK input.
Figure 13:
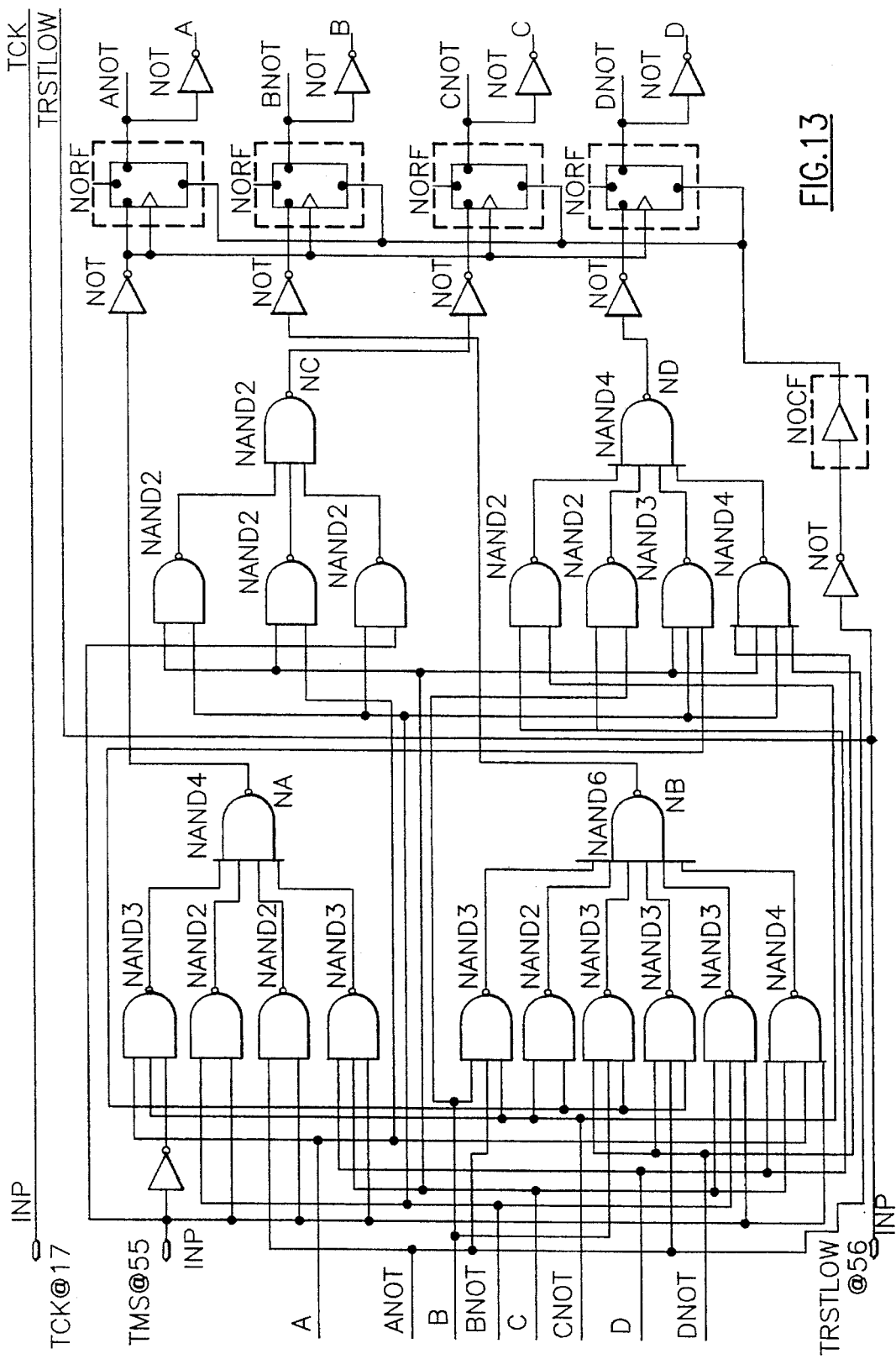
FIG. 13 shows the state machine schematic diagram of the test access port of the embedded chip.

While FIG. 14 illustrates one combinational circuit for use with Level Sensitive Scan Devices, other scan requirements may include specific scan and hold requirements which may be custom programmed into the Field Programmable Gate Array of FIGS. 12 and 13.

The Test Access Port Field Programmable Array can be embedded in the test fixture as shown in FIG. 11. Utilizing all of the features of the Field Programmable Gate Array permits the test system to perform a self diagnosis of the fixture and tester circuit prior to performing actual tests on actual cards under test. Moreover, the Field Programmable Gate Array can also have the IEEE 1149.1 Standard embedded therein, so that fixture tests can be automatically generated by the same software used to generate the test for the device, i.e., the chip or card, under test. All that is required is the Netlist describing the circuit under test and the Boundary Scan Descriptive Language ("BSDL") of the Field Programmable Gate Array.

Because the Field Programmable Gate Array's pins are connected to a programmable tester, the Field Programmable Gate Array itself can be programmed as part of the initialization of the tester. Once the circuit design of the Field Programmable Gate Array is set, the design software generates the programming commands that must be applied to the pins of the Field Programmable Gate Array. These commands are converted to test vectors by other software routines. The resulting vectors are then placed in the initialization routine of the tester.

The test system of the invention, including the test fixture and the test circuitry is useful for boundary testing a circuit network characterized by dissimilar integrated circuits therein. That is, the circuit under test has at least one first integrated circuit that is testable by IEEE 1149.1 Standard boundary testing, and at least one second integrated circuit that is testable by Level Sensitive Scan Design (LSSD) boundary testing but not by IEEE 1149.1 Standard boundary testing. The second integrated circuit chip is typically one requiring three clocks for testing.

FIG. 15, including FIG. 15A and FIG. 15B, is a side by side comparison of an IEEE 1149.1 Standard Boundary Scan Cell and a Level Sensitive Scan Device Boundary Scan Cell. Both cells have input data from the system logic and the mode, i.e., test or normal operations. In the IEEE 1149.1 Standard Cell shown in FIG. 15A there is an input from the previous cell, an input from the system logic and a mode select signal, and an input ShiftDR. This is outputted to logic clocked by ClockDR, which goes to the next cell, and to further logic clocked by UpdateDR which goes to the system logic and also feeds back to the input logic device.

FIG. 15B also shows a Level Sensitive Scan Device Boundary Scan Cell. In this arrangement, the data from the system logic and mode pass through logic to a latch with the A_CLK, the C_CLK, and the data from the last cell. The resultant of this latch then goes, with the B_CLK to another latch. The resultant is then input to the next cell and to the first latch of the first cell.

To test circuit networks with these disparate boundary scan logic types a test fixture as shown in FIG. 11 is utilized. This fixture interfaces directly with the IEEE 1149.1 Standard device on the card, and through the Field Programmable Gate Array, including the Test Access Port integrated circuit chip, to the Level Sensitive Scan Device.

The fixture includes a test access port interface and associated circuitry. The test access port interface is provided through the separate TAP chip, having the logic shown in FIG. 12. The TAP interface on the chip includes a test access port controller with Test Clock, Test Data In, Test Data Out, Test Mode Select, and Test Reset I/O. The associated circuitry includes an instruction register, a bypass register, and a clock generator.

As shown in FIG. 12 the Test Access Port chip has the inputs Test Data Inhibit (TDI), Test Mode Selector (TMS), Test Reset (TRST), and Test Clock (TCLK) and the output Test Data Output (TDO). The Test Access Port (TAP) itself has three outputs to the Test Access Port Controller. These are the TMS, the TRST, and the TCLK.

The TAP controller is the state machine that interfaces with the test access port. The TAP controller outputs drive the Instruction Register (IR) shown in FIG. 16, the Boundary Scan Control Logic shown in FIG. 17, and the Bypass Register shown in FIG. 18. Test Data Inhibit (TDI) is also an input to the Boundary Scan Register and the Boundary Scan Control Logic.

The Instruction Register (IR) drives the Instruction Decode logic, shown in FIG. 19, which drives the Bypass Register and the Boundary Scan Control Logic. The Instruction Register, the Bypass Register, and the LSSD boundary scan outputs are the input to the Test Data Output (TDO) Multiplexer. The output of the TDO Multiplexer is the Test Data Output, and it passes through the Test Access Port.

The TAP controller is a four-bit, 16 state machine. It has the states shown in the table below:

| Test Access Port Controller State | DCBA |
|---|---|
| Exit2-DR | 0000 |
| Exit1-DR | 0001 |
| Shift-DR | 0010 |
| Pause-DR | 0011 |
| Select-IR-Scan | 0100 |
| Update-DR | 0101 |
| Capture-DR | 0110 |
| Select-DR-Scan | 0111 |
| Exit2-IR | 1000 |
| Exit1-IR | 1001 |
| Shift-IR | 1010 |
| Pause-IR | 1011 |
| Run-Test/Idle | 1100 |
| Update-IR | 1101 |
| Capture-IR | 1110 |
| Test-Logic-Reset | 1111 |

The current state of the TAP Controller is changed by the Test Mode Select (TMS) input signal. The equations for next state logic are (where D, C, B, and A are the $2^3$, $2^2$, $2^1$ and $2^0$ bits respectively):

Next D=D ^C+D ^B+^TMS C ^B+^D C ^B ^A

Next C=C ^B+C A+TMS ^B

Next B=^TMS B ^A+^TMS ^C+^TMS ^D B+ ^TMS C ^B +^TMS ^DA+TMS D C A

Next A=^TMS ^C A+TMS ^B+TMS ^A+TMS D C.

The four latches that hold the current state of the TAP controller can be D flip flops, for example triggered by TCK's rising edge. Whenever the tester reset signal, TRST, is applied low the four latches are set and the state of the machine is 1111. This is the test Logic Reset State, which resets all of the Test Access Port logic.

The Test Access Port controller outputs include both latched and unlatched outputs. The latched outputs, which are cleared when Test Reset Logic is set low, are CAPTDR, SHIFTDR, SHIFTIR, ENABLE, and RESET. The latched outputs, CAPTDR and SHIFTDR are used to control the two data registers, the bypass register on the Test Access Port chip, and the Boundary Scan register on the Level Sensitive Scan Device chip.

The SHIFTIR is used to control the Test Access Port chip instruction register. ENABLE is active high whenever the Test Access Port Controller is in the Shift-IR or Shift-DR state. ENABLE enables the Test Data Output whenever a shift operation is occurring, so that the scan data is passed to the tester.

The fifth latched control line is the RESET line. RESET is different from Tester Reset, TRST. It is an active low line that is turned on whenever the state machine is in the Test Logic Reset State (1111). During this 1111 state the RESET line sets the latches in the instruction register to 1, so that the decoded instruction is the bypass instruction.

The Test Access Port controller also outputs seven unlatched signals. Two of these unlatched signals, CLOCKDR and UPDATDR are used to clock D flip-flops in the data registers and instruction register. The SELECT line is high whenever the most significant bit in the state code is 1. The most significant bit is 1 whenever the Test Access Port chip is in an instruction related state.

SELECT allows the scan output of the instruction register to be the TDO (Test Data Output) output. When SELECT is low a data register passes the scan out information to the TDO (Test Data Output).

SELECTDRSCAN and CAPTDR2 are unlatched signals. They help control the DI1 line. Specifically, these two signals allow DI1 to remain high during the Select-DR-Scan and Capture-DR states, independent of the TCK edge.

The instruction register is a 2-bit register that implements logic shown in FIG. 19 and the instructions shown in TABLE below:

| INSTRUCTION | CODE |
|---|---|
| Bypass | 11 |
| Extest | 00 |
| Preload | 10 |
| Invalid Instruction (default to Bypass 11) | 01 |

The least significant bit of the instruction register is the bit closest to the TDO output.

As shown in FIG. 19 each bit of the instruction register utilizes three pieces of logic, a multiplexer and two D-flip-flops. The multiplexer allows a scan chain to pass through to the first D flip flop when SHIFTIR is high. This is how the test instruction is loaded into the tester. When SHIFTIR is low, the output of the two multiplexers is a 1 for the most significant bit and a 0 for the least significant bit, as specified by IEEE 1149.1 Standard.

The data passed to the D flip flop from the multiplexers is clocked whenever the CLOCKIR signal pulses, i.e., during the CAPT-IR and SHIFT-IR states. The output of the most significant bit's first flip flop is the scan input to the Least Significant Bit's multiplexer, allowing Test Data In (TDI) to shift through the instruction register bits. When TDI (Test Data In) has finished shifting and the first set of D flip-flops contain an instruction, the UPDATEIR (Update Instruction Register) pulses once, clocking outputs of the first flip flops into the second pair of flip-flops. The outputs of the second pair of flip-flops go to the instruction decoder.

The second set of flip-flops is set whenever TRSTLO or RESET is low, thereby sending a "11" Bypass instruction to the instruction decode logic.

The output of the Least Significant Bit's first D flip-flop goes to the Test Data Out (TDO) multiplexer. During instruction register operation, the multiplexer selects this output as TDO. The first two bits shifted out of TDO during an instruction register operation are always 1 followed by 0. This sequence corresponds to the Least Significant Bit and Most Significant Bit latches' $V_{cc}$ and ground multiplexer inputs. These two bits allow the tester to verify that the instruction register contents were passed to TDO.

The instruction decoder of FIG. 19 is actually a demultiplexer that separates the four possible states of its two input lines into the four instruction codes, including the invalid instruction code. If either the Bypass or the Invalid code is present, the BYPSEL line goes high, selecting the bypass register as the data register to use during data operations. If either the Extest or Preload commands occur, the BSSEL line is high and the Level Sensitive Scan Design device's boundary scan register is selected as the test data register.

The Bypass register is a one bit register. It allows TDI (Test Data In) to pass directly through the Test Access Port chip during the Bypass instruction. Moreover, as a safety precaution, the Bypass register is also selected as the test data register during an invalid instruction code. That is, TDI is shifted into the Bypass register whenever both BYPSEL and SHIFTDR signals are high. TDI is clocked whenever both BYPSEL and CLOCKDR are active.

The Level Sensitive Scan Device boundary scan register of the system has three clocks and four additional control input signals. These clock signals are the three LSSD clocks: CLK_A, CLK_B, and CLK_C. The control signals also include the boundary scan output, BSCO, and the boundary scan input, BSCI. The controls also include data inhibit, DI1.

BSCO and BSCI operate similarly to the lines that shift TDI inputs in the other Test Access Port registers. BSCO and BSCI are high when both SHIFTDR and BSSEL (the boundary scan register select line) are high. BSCO and BSCI are also high when both the UPDATEDR and BSSEL lines are high. BSCO and BSCI control the input to the LSSD boundary scan latches.

In the test system the BSCO controls boundary scan cells on the Level Sensitive Scan Device integrated circuit chip associated with drivers, and the BSCI controls boundary scan cells on the Level Sensitive Scan Device integrated circuit chip associated with receivers. This is shown in FIGS. 17 and 18. When BSCO and BSCI are both high, the L2 input to the latch multiplexer is selected. This allows the latch to retain its current L2 value during the Shift-DR state, rather than passing a data value to the chip logic.

The L2 data shifted into the boundary scan cell is passed to the chip logic during the Update-DR state, instead of passing data from D0. This allows the data shifted into the driver boundary scan cells to be sent over the nets during the Update-DR state. This is essential for Preload and Extest functions.

The Level Sensitive Scan Device Boundary Scan Register controls the Boundary Scan Input, BSCI, and the Boundary Scan Output, BSCO, when Test Access Port control lines Shift Data Register, SHIFTDR, and Boundary Scan Register Select, BSSEL, are high. The Level Sensitive Scan Device Boundary Scan Register also controls BSCO and BSCI when Test Access Port control lines Update Data Register UPDATDR, and Boundary Scan Register Select BSSEL are high.

The Data Inhibit Signal DI1 is high and data is sent out to the circuit network from the Level Sensitive Scan Device integrated circuit chip when the Boundary Scan Select BSSEL and one of Update Data Register, Select Data Register, or Capture Data Register is high. The Data Inhibit DI1 is connected to the inhibit pins of the Level Sensitive Scan Device. By this expedient when DI1 is low no signals are transmitted over the circuit network from non-selected second integrated circuit chips. When the Data Inhibit DI1 is high the Level Sensitive Scan Device chip drivers are enabled and Level Sensitive Scan Device boundary scan cell contents are transmitted over the circuit network from selected second integrated circuit chips.

The scan output of the LSSD chip's boundary scan register is connected to the Test Access Port chips' BSSCN input. This is a path from the boundary scan register to the TDO. The BSSCNINV is also provided.

In addition to three control signals, LSSD chips must have three clocks in order to operate properly. However, the IEEE 1149.1 Standard only provides a Test Clock, TCK. The logic used to provide the three LSSD clocks is shown in FIG. 14.

Two clock chopper circuits are used to form the C1 clock, used to form both LSSD L1 clocks, and the C2 clock, used for the LSSD L2 B_CLK. In addition, for certain LSSD chips, an input clock control, INPCKCTL, may be required to connect to the LSSD chip's clock oscillator input. This input must be high when B_CLK is pulsed and low when either of the two L1 clocks, A_CLK or C_CLK, is pulsed. INPCKCTL is formed by clocking the values of TCK with a signal that is an exclusive-NOR of C1 and C2. The waveforms for C1, C2, and INPCKCTL are shown in FIG. 21.

During shifting operations, the scan chain must be passed back to the tester through TDO. The TDO multiplexer chooses the appropriate path for the scan chain. If SELECT is high an instruction operation is occurring, and TDI is allowed to pass through the instruction register to TDO. If SELECT is low, one of the two data register operations is occurring. If BYPSEL is high, the bypass register output connected to TDO, since a bypass instruction is taking place. If BYPSEL is not high, then the LSSD boundary scan register is connected to the TDO, since either an Extest or Preload instruction is taking place. A timing diagram for the Test Access Port chip is shown in FIG. 21.

Thus, using the method and fixture of the invention it is possible to use a single test fixture for testing a card or board containing both LSSD and IEEE 1149.1 Standard devices in a single testing operation. According to a further embodiment of our invention there is now provided a method of testing a card or board containing both LSSD and IEEE 1149.1 Standard devices in a single testing operation.

While the invention has been described with respect to certain preferred embodiments and exemplifications, it is not intended to limit the scope of the invention thereby, but solely by the claims appended hereto.

We claim:

1. A test fixture for boundary testing a circuit network having at least one first integrated circuit testable by IEEE 1149.1 Standard boundary testing, and at least one second integrated circuit testable by Level Sensitive Scan Design boundary testing but not by IEEE 1149.1 Standard boundary testing, and requiring three clocks for testing; said test fixture comprising a test access port interface comprising:
   a. a test access port controller with Test Clock, Test Data In, Test Data Out, Test Mode Select, and Test Reset I/O means;
   b. an instruction register;
   c. a bypass register;
   d. a test clock; and
   e. a Level Sensitive Scan Device boundary scan register having the control input signals:
      i. LSSD clocks CLK A, CLK B, and CLK C;
      ii. boundary scan output BSCO controlling boundary scan cells on the Level Sensitive Scan Device integrated circuit chip associated with drivers;
      iii. boundary scan input BSCI controlling boundary scan cells on the Level Sensitive Scan Device integrated circuit chip associated with receivers; and
      iv. data inhibit, DI1.

2. The test fixture of claim 1 wherein the Level Sensitive Scan Device Boundary Scan Register controls BSCO and BSCI when Test Access Port control lines Shift Data Register SHIFTDR, and Boundary Scan Register Select BSSEL are high.

3. The test fixture of claim 1 wherein the Level Sensitive Scan Device Boundary Scan Register controls BSCO and BSCI when Test Access Port control lines Update Data Register UPDATDR, and Boundary Scan Register Select BSSEL are high.

4. The test fixture of claim 1 wherein the Data Inhibit Signal DI1 is high and data is sent out to the circuit network from the Level Sensitive Scan Device integrated circuit chip when Boundary Scan Select BSSEL and one of Update Data Register, select Data Register, or Capture Data Register is high.

5. The test fixture of claim 1 wherein the Data Inhibit DI1 is connected to the inhibit pins of the Level Sensitive Scan Device whereby when DI1 is low no signals are transmitted over the circuit network from non-selected second integrated circuit chips.

6. The test fixture of claim 1 wherein the Data Inhibit DI1 is connected to the inhibit pins of the Level Sensitive Scan Device whereby when DI1 is high the Level Sensitive Scan Device chip drivers are enabled and Level Sensitive Scan Device boundary scan cell contents are transmitted over the circuit network from selected second integrated circuit chips.

7. A method for boundary testing a circuit network having at least one first integrated circuit testable by IEEE 1149.1 Standard boundary testing, and at least one second integrated circuit testable by Level Sensitive Scan Design boundary testing but not by IEEE 1149.1 Standard boundary testing, and requiring three clocks for testing; said method comprising inserting said circuit network in a test fixture comprising a test access port interface comprising:

a. a test access port controller with Test Clock, Test Data In, Test Data Out, Test Mode Select, and Test Reset I/O means;

b. an instruction register;

c. a bypass register;

d. a test clock generator; and e. a Level Sensitive Scan Device boundary scan register having the control input signals:
  i. LSSD clocks CLK A, CLK B, and CLK C;
  ii. boundary scan output BSCO controlling boundary scan cells on the Level Sensitive Scan Device integrated circuit chip associated with drivers;
  iii. boundary scan input BSCI controlling boundary scan cells on the Level Sensitive Scan Device integrated circuit chip associated with receivers; and
  iv. data inhibit, DI1; and applying test signals to the IEEE 1149.1 Standard first integrated circuit through the test access port controller, and applying test signals to the Level Sensitive Scan Device second integrated circuit through the test access port and the Level Sensitive Scan Device boundary scan register.

8. The method of claim 7 wherein the Level Sensitive Scan Device Boundary Scan Register controls BSCO and BSCI when Test Access Port control lines Shift Data Register SHIFTDR, and Boundary Scan Register Select BSSEL are high.

9. The method of claim 7 wherein the Level Sensitive Scan Device Boundary Scan Register controls BSCO and BSCI when Test Access Port control lines Update Data Register UPDATDR, and Boundary Scan Register Select BSSEL are high.

10. The method of claim 7 wherein the Data Inhibit Signal DI1 is high and data is sent out to the circuit network from the Level Sensitive Scan Device integrated circuit chip when Boundary Scan Select BSSEL and one of Update Data Register, Select Data Register, or Capture Data Register is high.

11. The method of claim 7 herein the Data Inhibit DI1 is connected to the inhibit pins of the Level Sensitive Scan Device whereby when DI1 is low no signals are transmitted over the circuit network from non-selected second integrated circuit chips.

12. The method of claim 7 wherein the Data Inhibit DI1 is connected to the inhibit pins of the Level Sensitive Scan Device whereby when DI1 is high the Level Sensitive Scan Device chip drivers ate enabled and Level Sensitive Scan Device boundary scan cell contents are transmitted over the circuit network from selected second integrated circuit chips.

* * * * *